United States Patent [19]

Iigima

[11] Patent Number: 4,639,691
[45] Date of Patent: Jan. 27, 1987

[54] OSCILLATOR

[75] Inventor: Kouta Iigima, Souma, Japan

[73] Assignee: Alps Electric Co., Ltd., Japan

[21] Appl. No.: 784,339

[22] Filed: Oct. 4, 1985

[30] Foreign Application Priority Data

Oct. 4, 1984 [JP] Japan ............................ 59-150397[U]

[51] Int. Cl.$^4$ ............................ H03B 5/18; H03B 7/12
[52] U.S. Cl. ................................. 331/99; 331/107 SL; 331/179; 333/235
[58] Field of Search ............... 331/99, 107 SL, 117 D, 331/177 V, 179; 333/221, 235, 238, 246, 260; 334/15, 41, 47; 455/182, 198

[56] References Cited

U.S. PATENT DOCUMENTS 3,766,494 10/1973 Anbe et al. ............................ 331/99
3,921,056 11/1975 Mahoney ............................ 331/99 X
4,140,982 2/1979 Alexander ..................... 331/117 D X
4,375,621 3/1983 Schneiter et al. ........... 331/177 V X Primary Examiner—Eugene R. LaRoche
Assistant Examiner—James C. Lee
Attorney, Agent, or Firm—Guy W. Shoup

[57] ABSTRACT

Herein disclosed is an oscillator having a micro-strip line for acting as a resonance line. A frequency controlling variable capacitor is connected with one terminal of the micro-strip line and arranged such that it can be controlled by a voltage applied. An auxiliary micro-strip line has its one terminal connected at least in a high-frequency manner with the one terminal of the micro-strip line and its other terminal made connectable with the micro-strip line. A switch is provided for connecting the other terminal of said auxiliary strip line with said micro-strip line so that it may be turned on or off to switch the oscillation frequency in dependence upon whether or not the auxiliary resonance line is connected in parallel with the micro-strip line.

2 Claims, 7 Drawing Figures

OSCILLATOR

BACKGROUND OF THE INVENTION

1. Field of the Invention

The present invention relates to an oscillator and, more particularly, to an oscillator which is constructed to reduce deterioration in performance due to switching of different frequencies when transmission and reception are conducted with the different frequencies by using one oscillator.

2. Description of the Prior Art

In case wireless communications are to be conducted by means of one oscillator such as an oscillator using a micro-strip line as a resonance line, there has been used in the prior art a local oscillation frequency with which a shortened resonance circuit of $\frac{1}{2}\lambda$ type having a resonance line equipped at its two terminals with capacitors $C_1$, $C_2$, $C_{01}$, $C_{02}$ and so on is oscillated by means of a transistor TR, as shown in FIG. 4. The oscillator constructs the so-called "voltage-controlled oscillator (VCO)" in which an oscillation frequency to be transmitted in the form of a shown output signal is subjected to a voltage control by the voltage level of a shown controlling input signal to be fed to a varactor $BD_1$. In order that the oscillation frequency may be shifted to correspond to either of the frequencies for the transmission or reception, moreover, the resonance line 1 is loaded in parallel with the capacitor $C_2$ to change the load capacitance by applying a forward voltage to a diode $D_1$ to render it conductive with a shown shifting input signal.

With the construction thus made according to the prior art, as shown in FIG. 4, the load capacitor $C_1$ is connected or not in parallel with the righthand terminal of the resonance line 1 in response to the conduction or inconduction of the diode $D_1$. As a result, there arises a defect that the variable value of the frequency by the shown varactor $BD_1$ is changed. If, at this time, the value Q of the resonance circuit is to be increased, it is necessary to reduce the characteristic impedance of the resonance line 1 to a small value. This necessity raises a problem that the load capacitance is further increased together with the influences of the above-specified defect. If the capacitance of the load capacitor connected with the terminal of the resonance line 1 varies, as shown in FIG. 5, the shown node point shifts to raise other problems that the level of the output to be extracted is accompanied by a difference and that the oscillating condition fluctuates in accordance with the shift of the node point to make it difficult to attain the optimum oscillating condition. If the characteristic impedance is reduced to increase the value Q of the resonance line 1, moreover, the load capacitor $C_2$ has its capacitance increased so that the value of the high-frequency current to flow through the switching element (e.g., the diode) is increased to make the resistance $R_s$ innegligible for the SW-ON thereby to raise a further problem that the value Q of the resonance circuit cannot be increased.

SUMMARY OF THE INVENTION

It is, therefore, an object of the present invention to provide an oscillator which is freed from any of the problems thus far described.

When the transmission and reception are to be effected with different frequencies by using one oscillator, according to the present invention, another but auxiliary oscillation line is connected in parallel with the aforementioned oscillation line 1 so that stable and different oscillation frequencies are generated by switching the frequencies in dependence upon whether or not the auxiliary oscillation line is connected in so-to-speak "parallel" with the oscillation line 1.

According to a feature of the present invention, there is provided an oscillator comprising: a micro-strip line for acting as a resonance line; a frequency controlling variable capacitor connected with one terminal of said micro-strip line and arranged such that it can be controlled by a voltage applied; an auxiliary micro-strip line having its one terminal connected at least in a high-frequency manner with the one terminal of said micro-strip line and its other terminal made connectable with said micro-strip line; and a switch for connecting the other terminal of said auxiliary strip line with said micro-strip line so that it may be turned on or off to switch the oscillation frequency.

BRIEF DESCRIPTION OF THE DRAWINGS

Other objects, features and advantages of the present invention will become apparent from the following description taken in conjunction with the accompanying drawings, in which:

FIGS. 2 FIGS. 3A and 3B and FIGS. 1A-3B 3 are schematic diagrams for explaining the operations of the oscillator of the embodiment of the present invention shown in FIG. 1;

DESCRIPTION OF THE PREFERRED EMBODIMENT

Figure 1:
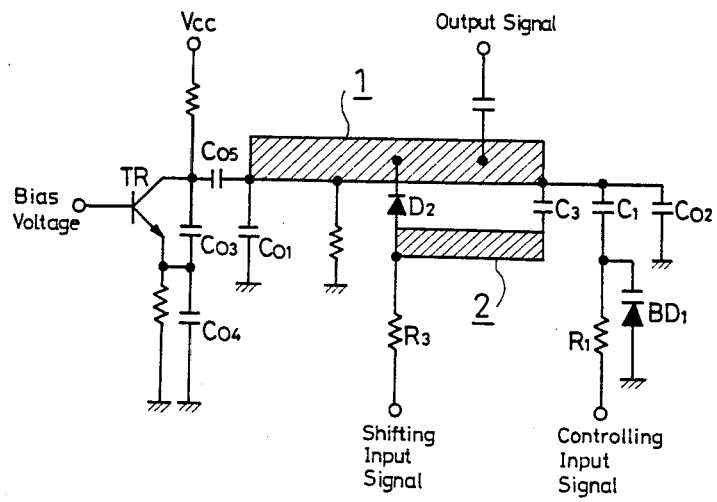
FIG. 1 is a circuit diagram showing an oscillator according to one embodiment of the present invention.

In FIGS. 1 to 3: reference numerals 1 and 2 indicate resonance lines; letters C, $C_{01}$ to $C_{05}$, $C_1$ and $C_3$ indicate capacitors; letters $R_1$ and $R_3$ indicate resistors; and letters TR indicate a transistor.

Although the oscillator is rendered operative by the shown transistor TR like the prior art, as shown in FIG. 1, the shown resonance line 2 or the so-called "auxiliary micro-strip line" is added according to the present invention and has its one terminal connected with one terminal of the resonance line through the capacitor $C_3$. And, the other terminal of the resonance line 2 is connected in parallel with the resonance line 1 by applying a forward voltage to a diode $D_2$ through the shown resistor $R_3$. By thus connecting the resonance line 2 in parallel with the resonance line 1, the micro-strip line has its line impedance dropped so that the oscillation frequency is increased. By applying no forward voltage to the diode $D_2$, on the contrary, the other terminal of the resonance line 2 is disconnected from the resonance line 1. As a result, the load capacitor C, which is determined by both the shown capacitor $C_3$ and the capacitor provided by the resonance line 2, is connected with the one terminal of the resonance line 1 so that the oscillation frequency is decreased. At this time, the resonance line 2 is made slightly shorter than $\frac{1}{4}\lambda$, for example, so that it may become capacitative with respect to the resonance line 1. The construction and operations of the oscillator will be described consecutively in more detail, as follows.

By rendering the shown transistor TR operative, the circuit containing the resonance line 1 constructing the micro-strip line is brought into its oscillatory state. The frequency is shifted by switching the shown shifting input signal to the form at an H or L level. Moreover, the adjustment of the frequency is conducted in response to the shown controlling input signal by controlling the voltage to be applied to the shown varactor $BD_1$.

The case in which the oscillation frequency is to be shifted will be described in more detail.

First of all, the operations in case the signal at the L level is fed as the shown shifting input signal to the circuit shown in FIG. 1 will be described in the following with reference to FIG. 2.

Figure 2A:
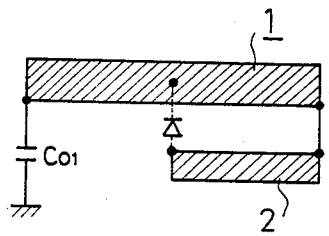
Figure 2B:
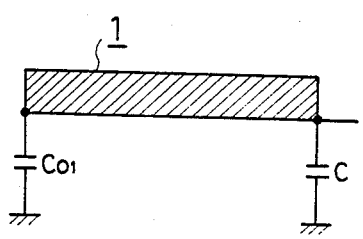

If the signal at the L level is fed as the shown shifting input signal, the diode $D_2$ shown in FIG. 1 is rendered inconductive, i.e., released so that the resonance line 2 comes into the state, in which it is connected only with the righthand terminal of the resonance line 1 through the capacitor $C_3$, as shown in FIG. 2(A). This is equivalent to that the capacitor C or the combination of the capacitor $C_3$ and the capacitor owned by the resonance line 2 is connected with the righthand terminal of the resonance line 1, as shown in FIG. 2(B). As a result, the resonance line 1 is loaded at its righthand terminal with the capacitor C so that its oscillation frequency is decreased.

Next, the operations in case the signal at the H level is fed as the shown shifting input signal to the circuit shown in FIG. 1 will be described with reference to FIG. 3.

Figure 3A:
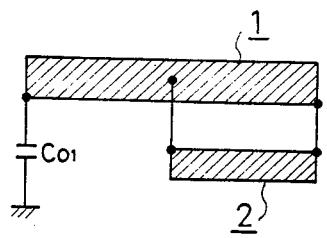
Figure 3B:
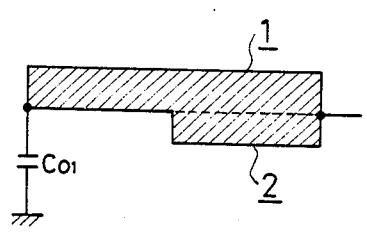

If the signal at the H level is fed as the shown shifting input signal, the diode $D_2$ shown in FIG. 1 is rendered conductive, i.e., short-circuited so that the resonance line 2 comes into the state in which it is connected in so-to-speak "parallel" with the resonance line 1, as shown in FIG. 3(A). This is equivalent to that the micro-strip line located at the righthand side from the center of the resonance line 1 is made thick, as shown in FIG. 3(B), so that it acts to drop the line impedance. As a result, the oscillation frequency of the resonance one 1 is increased.

Figure 4:
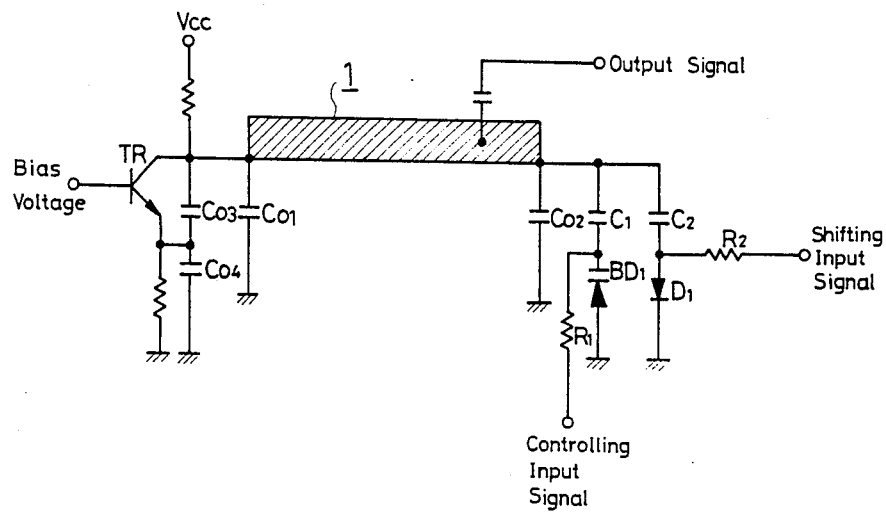
FIG. 4 is similar to FIG. 1 but shows the oscillator of the prior art.
Figure 5:
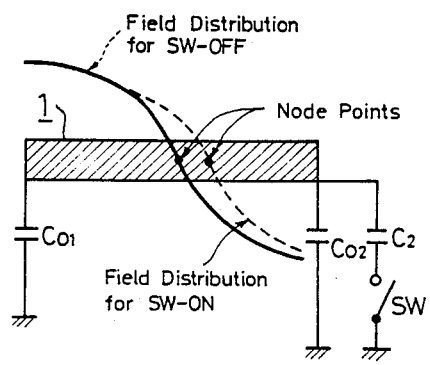
FIG. 5 is a schematic diagram for explaining the operations of the oscillator of the prior art shown in FIG. 4.

As compared with the case in which the terminal capacitor (e.g., the capacitor $C_2$ shown in FIG. 4) used in the prior art is turned on or off by the switch element, the load capacitor of the resonance line 1 can be dropped for the shift of the common frequency by adopting the construction thus far described so that the difference in the control sensitivity upon the switching operation of the switch element can be reduced. Likewise, the fluctuations of the load capacitor before and after the shifting operation of the frequency so that the shift of the node point is reduced together with the fluctuations of the oscillating condition. If the value Q of the oscillator is to be enlarged in the prior art, moreover, it is necessary to reduce the resonance line impedance. This necessity enlarges the load capacitance when the switch element switches so that the internal resistance $R_s$ of the shifting diode $D_1$ cannot be neglected. This causes restrictions upon the increase in the value Q. According to the present invention, however, the frequency is so-to-speak "shifted" by using the line impedance and the terminal capacitance so that the influences from the internal resistance $R_s$ of the diode can be reduced and so that the value Q of the circuit can be increased.

As has been described hereinbefore, according to the present invention, when the transmission and reception are to be conducted with the different frequencies by using the one oscillator, another auxiliary resonance line is connected in parallel with the existing resonance line and has its one terminal connected with one terminal of the resonance line so that the frequencies are switched in dependence upon whether or not the other terminal of the auxiliary resonance line is connected in so-to-speak "parallel" with the resonance line. As a result, it becomes possible to generate the output signal having a stable amplitude and to made the value Q of the resonance circuit larger than that of the prior art.

What is claimed is:

1. An oscillator comprising:
   a microstrip line acting as a resonance line having an input terminal for receiving an input signal and an output terminal for providing an output signal of a selected oscillation frequency in response to said input signal;
   a frequency controlling variable capacitor having one end connected to said input terminal of said microstrip line for providing said input signal to said micro-strip line in accordance with a controlling voltage signal applied to its other end;
   an auxiliary micro-strip line having one terminal connected with said input terminal of said micro-strip line and another terminal thereof being connectable to a part of said micro-strip line, said auxiliary micro-strip line providing a capacitance to said input terminal of said micro-strip line when its other terminal is not connected thereto such that the oscillation frequency of the output signal is at one level, and said auxiliary micro-strip line acting to decrease the line impedance of said micro-strip line when its other terminal is connected with said part of said micro-strip line such that the oscillation frequency of the output signal is increased to another level; and
   a switch for connecting and disconnecting said other terminal of said auxiliary micro-strip line with and from said part of said micro-strip line so that the oscillation frequency of the oscillator may be switched between said one or the other levels.

2. An oscillator according to claim 1, wherein said other terminal of said auxiliary micro-strip line is connected in parallel with said part of said micro-strip line through a diode which is rendered conductive or nonconductive by a shifting level input signal.

* * * * *